US008332788B1

(12) United States Patent
Young et al.

(10) Patent No.: US 8,332,788 B1
(45) Date of Patent: Dec. 11, 2012

(54) GENERATING A MODULE INTERFACE FOR PARTIAL RECONFIGURATION DESIGN FLOWS

(75) Inventors: Jay T. Young, Louisville, CO (US); W. Story Leavesley, III, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/077,544

(22) Filed: Mar. 31, 2011

Related U.S. Application Data

(62) Division of application No. 11/891,141, filed on Aug. 8, 2007, now Pat. No. 7,941,777.

(51) Int. Cl.
*G06F 17/50* (2006.01)
(52) U.S. Cl. ........................ 716/104; 716/126; 716/132
(58) Field of Classification Search .................. 716/104, 716/126, 132
See application file for complete search history.

(56) References Cited

U.S. PATENT DOCUMENTS

| | | | |
|---|---|---|---|
| 6,292,021 B1 * | 9/2001 | Furtek et al. | 326/41 |
| 6,694,464 B1 * | 2/2004 | Quayle et al. | 714/725 |
| 7,224,183 B2 | 5/2007 | Baeckler et al. | |
| 7,282,949 B2 | 10/2007 | Goodnow et al. | |
| 7,337,422 B1 | 2/2008 | Becker et al. | |
| 7,478,357 B1 | 1/2009 | Mason et al. | |
| 7,509,617 B1 | 3/2009 | Young | |
| 7,600,210 B1 | 10/2009 | Mason et al. | |
| 7,673,272 B1 | 3/2010 | Young | |

OTHER PUBLICATIONS

U.S. Appl. No. 11/891,141, filed Aug. 8, 2007, Young et al.

* cited by examiner

*Primary Examiner* — Thuan Do
(74) *Attorney, Agent, or Firm* — Kevin T. Cuenot; Lois D. Cartier

(57) ABSTRACT

A method of processing a logical netlist for implementing a circuit design within a programmable integrated circuit includes identifying a dynamically reconfigurable module (DRM) comprising a port from the logical netlist. The DRM defines a dynamically reconfigurable region of the integrated circuit that communicates with a module that is not dynamically reconfigurable via the port. First circuitry of the DRM and circuitry external to the DRM are implemented. The first circuitry connects to the circuitry external to the DRM via the port. The circuitry external to the DRM is within the module that is not dynamically reconfigurable. The method further includes locking routing resources connecting the circuitry external to the DRM to a location associated with a boundary of the DRM for the port; and implementing second circuitry of the DRM by reusing the locked routing resources. The second circuitry is routed to connect to the location associated with the boundary of the DRM for the port.

18 Claims, 5 Drawing Sheets

GENERATING A MODULE INTERFACE FOR PARTIAL RECONFIGURATION DESIGN FLOWS

FIELD OF THE INVENTION

The embodiments disclosed herein relate to the field of programmable logic devices and, more particularly, to partial dynamic reconfiguration of such devices.

BACKGROUND

Electronic circuit designs can be constructed, simulated, debugged, and translated into electronic hardware using a High Level Modeling System (HLMS). Typically, an HLMS is implemented as a software-based design tool which provides blocks that can be combined to build an electronic circuit. A block and a module refer to high level software constructs that represent a particular circuit function, such as multiplexing, addition, multiplication, or the like. Blocks and modules may have ports that can produce and consume signals, and may be arranged within the HLMS to form a circuit and/or system. Communication among the constructs can be represented by wires, or signals, that graphically link the constructs. The design may be simulated within the HLMS once it is constructed. Some HLMS tools can generate a hardware implementation from the block and/or module representation of the circuit design. For example, an HLMS may generate the bitstream necessary to program a programmable logic device (PLD) or generate the hardware description language (HDL) files necessary to specify the hardware design.

PLDs are a well-known type of integrated circuit. A PLD can be programmed by a user to perform specified logic functions. There are different types of PLDs, such as programmable logic arrays (PLAs), complex programmable logic devices (CPLDs), and field programmable gate arrays (FPGAs). An FPGA, for example, typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure can be programmed by loading a stream of configuration data, referred to as a bitstream, into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers.

One example of an HLMS is System Generator for DSP™, available from Xilinx, Inc. of San Jose, Calif. System Generator for DSP™ is a system level modeling tool that facilitates FPGA hardware design. System Generator for DSP™ provides a wide range of blocks that can be automatically compiled into a design suitable for an FPGA. Among these blocks are high level abstractions that implement complex functions, including digital signal processing as well as communication and control logic. In addition, access to underlying FPGA resources can be provided through low level block abstractions that facilitate the construction of highly efficient FPGA designs. (Xilinx and System Generator for DSP are trademarks of Xilinx, Inc. in the United States, other countries, or both).

Some modern FPGAs, and associated development tools, support a feature known as dynamic partial reconfiguration. Dynamic partial reconfiguration refers to the ability of a region of an FPGA to be reprogrammed to implement a plurality of different circuits while other regions of the FPGA continue to operate unchanged and uninterrupted. Typically, dynamic partial reconfiguration is performed to replace one function within the FPGA with a different function or circuit. In other words, the logic of the dynamically reconfigurable region of the FPGA is replaced with different logic, while the other regions of the FPGA remain unchanged. The new, or different, logic in the dynamically reconfigurable region of the FPGA may be entirely different from the logic that was replaced. There can be 2, 3, or more different circuit alternatives, or functions, that can be implemented within the dynamically reconfigurable region of the FPGA.

The dynamically reconfigurable region of the FPGA must continue to properly connect with other regions of the FPGA when the circuit implemented in that region is replaced with another circuit. One mechanism that has been used to ensure proper linkage between the dynamically reconfigurable regions of an FPGA and other regions is the bus macro. In general, a bus macro provides a mechanism for creating a physical connection on the FPGA that ensures that inputs and outputs of a dynamically reconfigurable region always properly connect to other regions of the FPGA.

Bus macros, however, can be complex to use and incorporate into a circuit design. Often, a circuit design includes hundreds, or possibly thousands, of connections between dynamically reconfigurable portions of the circuit design and the other portions. A bus macro is needed for each such connection. Each instance of a bus macro must be manually wired, or inserted, into the programmatic description of the circuit design. Another disadvantage of bus macros is that the inclusion of a bus macro introduces additional delay into that circuit design. Moreover, bus macro implementation requires additional resources beyond those needed to implement the original circuit design, thereby leaving fewer resources available for user logic.

SUMMARY

The present invention relates to creating an interface for partial reconfiguration design flows. One embodiment of the present invention can include a method of processing a logical netlist for implementing a circuit design within a programmable logic device (PLD). The method can include identifying a dynamically reconfigurable module (DRM) including at least one port from the logical netlist and determining whether the port connects with function logic for a function of the DRM. If so, logic connecting the function logic with logic external to the DRM can be inferred. If not, logic connecting the port of the DRM with logic that is external to the DRM can be inferred according to an attribute associated with the port. The method can include updating the logical netlist to specify the inferred logic.

The method includes replacing the inferred logic for the port of the DRM with a circuit element selected from the function logic connected to the port, removing the inferred logic for the port of the DRM, and/or routing a signal from the function logic of the DRM to the logic external to the DRM bypassing the inferred logic.

Inferring logic connecting the function logic with logic that is external to the DRM further includes selecting a lookup table as the inferred logic. In the event that the port does not connect with function logic, inferring logic connecting the port of the DRM with logic that is external to the DRM according to an attribute associated with the port can include determining that the attribute indicates asynchronous. In that case, the method can include selecting a lookup table as the inferred logic for each port having an attribute indicating asynchronous.

In the event that the port does not connect with function logic, inferring logic connecting the port of the DRM with logic that is external to the DRM according to an attribute associated with the port can include determining that the attribute indicates synchronous. In that case, the method can include selecting a lookup table and a flip flop as the inferred logic for each port having an attribute indicating synchronous.

The method further includes, for at least one other function of the DRM and each port of the at least one other function, inferring logic within the DRM for a port according to either the existence of function logic in the other function that connects to the port or an attribute indicating synchronous or asynchronous in the absence of function logic connecting to the port.

Another embodiment of the present invention includes a method of processing a logical netlist for implementing a circuit design within a PLD including identifying a DRM comprising at least one port from the logical netlist, implementing first function logic of the DRM and logic external to the DRM, wherein the first function logic connects to the logic external to the DRM via the port, and locking routing resources connecting the logic external to the DRM to a location associated with a boundary of the DRM for the port. The method further includes implementing second function logic of the DRM by reusing the locked routing resources such that the second function logic is routed to connect to the location associated with the boundary of the DRM for the port.

Locking the routing resources includes identifying a particular routing resource on the physical PLD that connects the logic external to the DRM to the location, where the location is on the boundary of the DRM, or identifying a particular routing resource on the physical PLD that connects the logic external to the DRM to the location, where the location is within the DRM such that the identified routing resource crosses the boundary of the DRM. Implementing the second function logic of the DRM includes reusing the identified routing resource such that the second function logic connects to the identified routing resource for the port.

Another embodiment of the present invention includes a computer program product including a computer-usable medium having computer-usable program code that, when executed, performs the various steps and/or functions described herein.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

Embodiments of the present invention relate to creating an interface for partial reconfiguration design flows. A programmable logic device (PLD), such as a field programmable gate array (FPGA), can support dynamic partial reconfiguration of one or more regions of the device. Accordingly, a circuit design to be implemented within a PLD that supports dynamic partial reconfiguration can include one or more dynamically reconfigurable modules (DRMs) and one or more modules that are not dynamically reconfigurable, i.e., static logic. A DRM typically has two or more different functions, or circuits, that can be implemented therein.

Each different function of the DRM must properly connect with each other portion of the circuit design. Such is the case whether the DRM is to connect to another DRM or static logic. Logic can be inferred from attributes associated with the interface of the DRM or from the logic specified within the DRM. Inferring logic effectively locks connections between the DRM and any other portions of the circuit design with which the DRM is to be connected. This ensures connectivity when the region of the FPGA that implements the DRM is dynamically reconfigured to implement different functions of the DRM.

Figure 1:
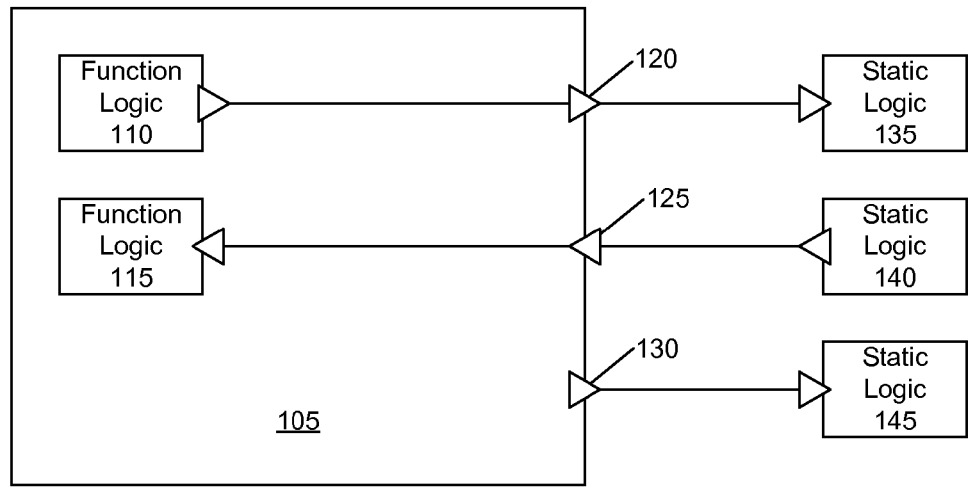
FIG. 1 is a block diagram illustrating a logical netlist in accordance with one embodiment of the present invention.

FIG. 1 is a block diagram illustrating a logical netlist 100 in accordance with one embodiment of the present invention. The logical netlist 100 specifies a circuit design that can be implemented within a PLD, such as an FPGA. As shown, the logical netlist 100 defines a design hierarchy including a DRM 105. The logical netlist 100 further can specify one or more different functions, or circuits, that can be implemented within the DRM 105.

The DRM 105 includes a plurality of ports such as output port 120, input port 125, and output port 130. In general, each port of the DRM 105, or any combination of ports of the DRM 105, can be referred to as an interface of the DRM 105. One or more portions of static user logic (static logic) 135, 140, and 145 can be located outside of the DRM 105. The static logic 135-145, unlike the DRM 105, remains fixed in that it implements a single function and cannot be dynamically reconfigured while the FPGA is active.

The particular function of the DRM 105 illustrated in FIG. 1 includes blocks of user logic, referred to herein as "function logic" 110 and 115. As shown, function logic 110 connects to static logic 135 via port 120. Static logic 140 connects to function logic 115 via port 125. No function logic connects with the static logic 145 through port 130. Via a dynamic partial reconfiguration process, another function with different logic can be implemented within a region of the FPGA in which the DRM 105 is implemented, while other regions of the FPGA remain active. That function may or may not specify function logic which connects to the static logic 145 via port 130.

For ease of illustration, the static logic 135-145 is depicted as being "flat" in that no hierarchy is shown. It should be appreciated, however, that the static logic 135-145 can be arranged according to a hierarchy in accordance with accepted, top-down design practices. Further, although one DRM is shown, additional DRMs can be specified in the logical netlist 100. It also should be appreciated that the embodiments disclosed herein can be applied to the case where one DRM connects with another DRM.

The HLMS can analyze the DRM 105 and infer logic to ensure that function logic of each function of the DRM 105 properly connects to the static logic 135-145 that is external to the DRM 105. The inferred logic ensures that connections are maintained across the boundary of the DRM 105 with other portions of the logical netlist 100, in this case static logic. The inferred logic can be determined from a review of the function logic, if specified, that connects with a port of the DRM 105. In the absence of function logic for a port of the DRM 105, the inferred logic can be determined from one or more attributes associated with each such port of the DRM 105.

In illustration, for both ports 120 and 125, function logic within the DRM 105 has been specified, e.g., function logic 110 and 115 respectively. Accordingly, the HLMS can analyze function logic 110 and function logic 115. Logic can be inferred within the DRM 105 which connects function logic 110 and static logic 135. Similarly, logic can be inferred within the DRM 105 that connects the static logic 140 with the function logic 115.

No function logic has been specified within the DRM 105 that connects with port 130. In that case, a circuit designer must specify an attribute that is associated with port 130. The attribute can describe the type of net that will be connected to port 130, and thus, the type of logic expected to be connected to port 130. It should be appreciated that with respect to FPGA devices, the type of net that is used for a given signal will vary according to whether the logic to which the net is connected is synchronous or asynchronous. In that regard, the attribute can indicate synchronous or asynchronous as a description of the net that will be connected to the port. Logic within the DRM 105 that connects to the static logic 145 will be inferred according to the attribute.

As noted, though the function illustrated in FIG. 1 includes no logic within the DRM 105 for port 130, another function may exist for the DRM 105 that does specify function logic that connects with port 130. For that function, the HLMS can identify the function logic that does connect to port 130 and infer logic for that function accordingly. The attribute associated with port 130 can be used as a default in cases where there is no user-specified function logic for a particular function of the DRM 105.

The use of attributes as discussed with reference to port 130 also can be useful in cases where a "black-box" implementation of the DRM 105 is performed. A black-box implementation refers to the case where the DRM 105 is specified, but does not include logic, for at least one or more functions. In that case, the circuit designer can associate an attribute with each port of the DRM 105. The attribute indicates the type of net to be connected to each respective port. In the absence of actual defined function logic for any function of the DRM 105, the attribute will be used to determine the logic to be inferred for that function. It should be appreciated that different logic can be inferred for a port for each function of the DRM 105 according to whether function logic for that port is specified, or the attribute of the port in the absence of function logic.

Figure 2:
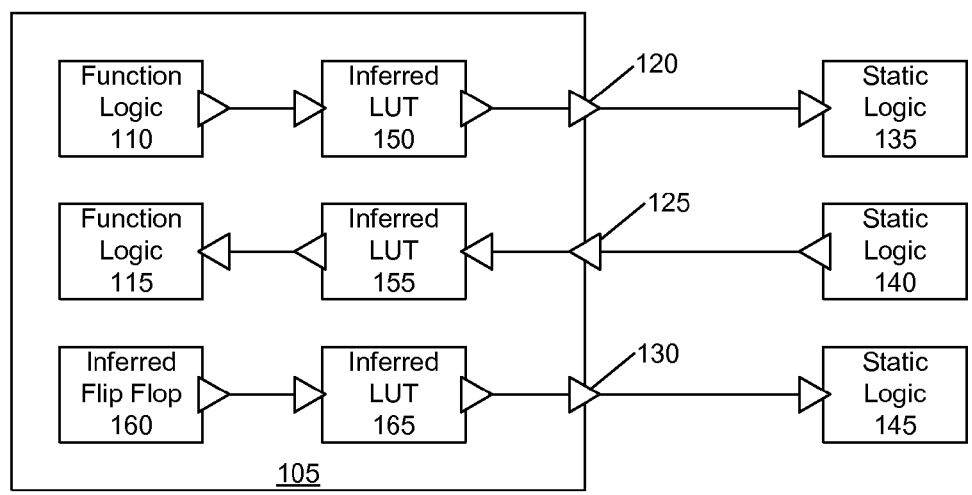
FIG. 2 is a block diagram illustrating a logical netlist in accordance with another embodiment of the present invention.

FIG. 2 is a block diagram illustrating the logical netlist 100 in accordance with another embodiment of the present invention. The logical netlist 100 has been processed and logic has been inferred which ensures that the user logic included within a function of the DRM 105 properly connects to the logic that is external to the DRM 105. As noted, since the particular function of the DRM 105 that is shown includes function logic 110 and function logic 115 connecting to ports 120 and 125 respectively, the logic that is inferred is a lookup table (LUT) for each of ports 120 and 125.

Accordingly, a LUT 150 has been inferred by the HLMS connecting function logic 110 to port 120 of the DRM 105. Similarly, the HLMS has inferred a LUT 155 connecting function logic 115 with port 125. Both inferred LUTs 150 and 155 can be configured as route-through LUTs. A route-through LUT refers to a configuration in which any signal provided to the LUT as an input will be passed through to the output of the LUT. A LUT can be inferred for a port whenever logic is specified for the port, regardless of whether that logic is synchronous or asynchronous. It should be appreciated that while a LUT is used as the inferred logic, other circuit elements can be used in lieu of a LUT which serve to lock routing resources as described herein. Accordingly, the present invention is not intended to be limited to the use of a LUT in those cases where function logic is specified for a port.

Since no user logic is specified within the DRM 105 for port 130, the HLMS can resort to the attribute associated with port 130. In this case, for example, the attribute can indicate that the type of net to be connected to port 130 will be synchronous. Accordingly, the HLMS can infer a flip flop 160 and a LUT 165 as shown. LUT 165 also can be configured as a route-through LUT.

If port 130 were configured as an input to the DRM 105, and still considered synchronous, a LUT, having a route-through configuration would be inferred along with a flip flop as shown. The LUT would be located closest to port 130. The signal directions, however, would be reversed in that the port 130 would be an input to the LUT. The LUT would drive the flip flop. If the attribute associated with port 130 indicated asynchronous, only a LUT would be inferred.

The inferred logic serves to lock the connections across the DRM 105 boundary. Inferring logic as described relieves the circuit designer from using more complex mechanisms, such as bus macros, for ensuring that a DRM properly connects with other portions of a circuit design. The insertion of a bus macro required the insertion of an entire block into the circuit description resulting in a changed circuit design hierarchy. In accordance with the embodiments described herein, logic can be inferred automatically by the HLMS according to user-specified attributes or from a review of the function logic implemented within the DRM without a change to the circuit design hierarchy.

Figure 3:
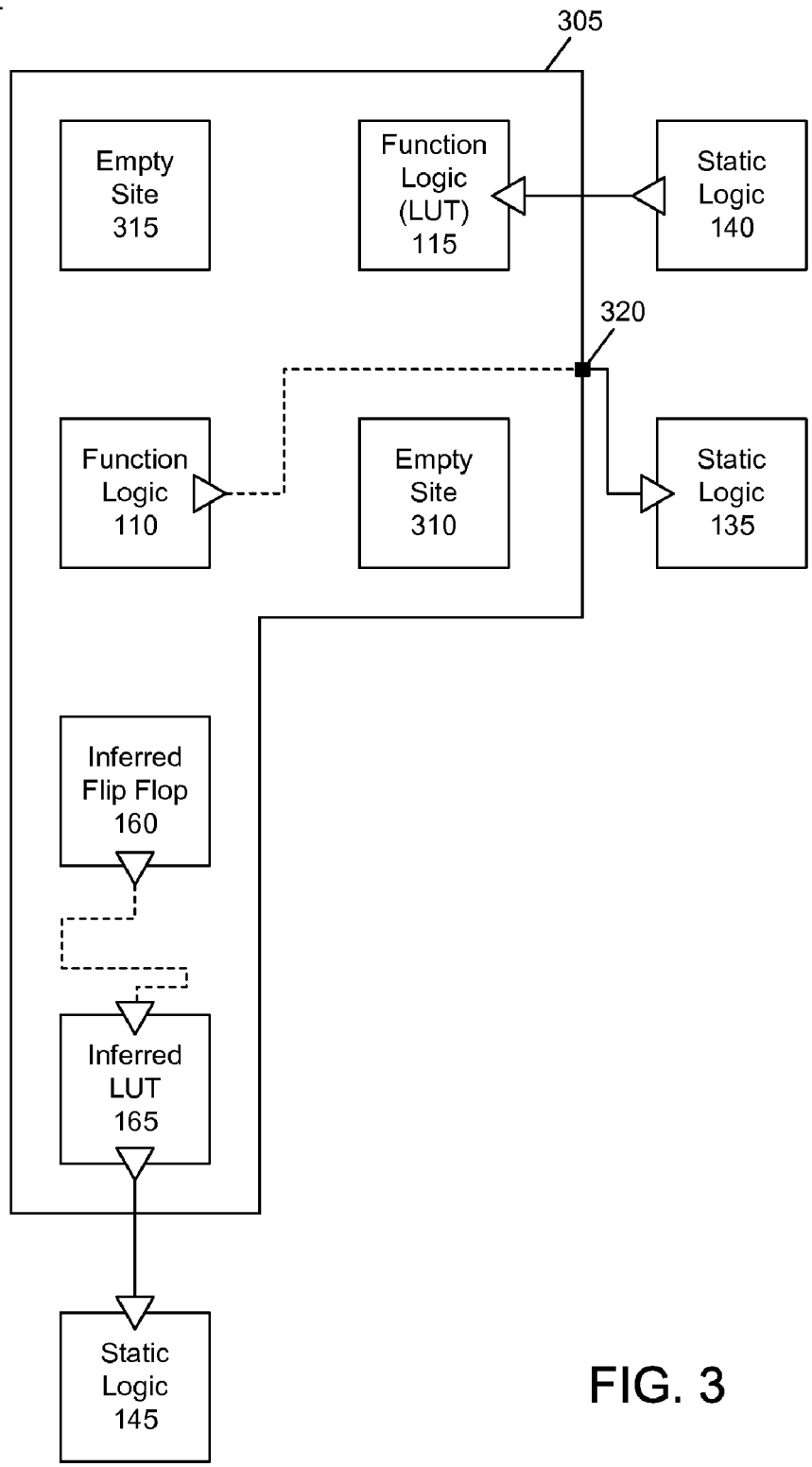
FIG. 3 is a block diagram illustrating a physical programmable logic device in accordance with another embodiment of the present invention.

FIG. 3 is a block diagram illustrating a physical programmable logic device (PLD) 300 in accordance with another embodiment of the present invention. FIG. 3 illustrates an exemplary physical implementation of the logical netlist illustrated in FIGS. 1 and 2, e.g., after mapping, placing, and routing the logical netlist onto the PLD 300, such as an FPGA. Accordingly, the blocks shown in FIG. 3 have been arranged in a different order than presented in FIGS. 1 and 2 to better illustrate this difference. One function of the DRM 105 has been implemented in a dynamically reconfigurable region 305 of the PLD 300.

FIG. 3 further illustrates various optimizations that can be applied to the circuit design. For example, consider function logic 110 within region 305. Function logic 110 had been connected to static logic 135 through the inferred LUT 150. In one embodiment, in cases where the inferred LUT is not necessary, the inferred LUT can be removed. This optimization can be performed, for example, after mapping and prior to place and route, or alternatively, after placement. Accordingly, as shown in FIG. 3, the inferred LUT 150 has been removed resulting in an empty site 310 within region 305. The route tool can route a path from function logic 110 to the static logic 135 for the function illustrated.

The route from user logic 110 to point 320, shown as a dotted line, illustrates routing of the function that will, or can, change from one function of the DRM to another as each is implemented within the region 305 of the PLD 300. Point 320 on the boundary of the region 305 represents a physical location on the device. The routing from point 320 to the static logic 135, can remain fixed from one function implementation within region 305 to the next. This ensures proper connectivity from one function to the next across the boundary of the dynamically reconfigurable region 305. That is, another function of the DRM, if connecting to static logic 135, will do so by being connected to physical point 320 as the routing from point 320 to static logic 135 will not change.

In another embodiment, to be described herein in greater detail, routing can be preserved as discussed with reference to the point 320 on the boundary of the region of the device in which the DRM is implemented. In that case, no inferred logic is necessary as the physical routing resources used to connect the function logic of the DRM with the logic external to the DRM can be identified and preserved, or locked, for use as a reference point of physical location to which other function logic, e.g., a second or third function of the DRM, will connect.

User logic 115 represents another type of optimization that can be performed. The HLMS can determine that the user logic 115 is coincident with the inferred logic, e.g., LUT 155. In that case, the user logic, i.e., a LUT or a gate, can be used in place of the inferred logic. The inferred logic can be removed. Such an optimization can be performed after mapping or after placement. A route connects function logic 115 and static logic 140. An empty site 315 exists where function logic 115 would likely have been located had LUT 155 remained in the circuit design. The route between function logic 115 and static logic 140 is illustrated as a solid line since the routing will remain constant for all functions implemented within the dynamically reconfigurable region 305.

The optimizations described above can provide several advantages. The replacement of inferred logic with user logic and/or the removal of inferred logic results in the removal of any delays introduced into the circuit from the inclusion of the inferred logic. Accordingly, the timing of the original circuit design can be preserved. In addition, resources of the PLD are conserved and, therefore, available for use as user logic rather than being used as part of the interface for the dynamically reconfigurable region 305.

The flip flop 160 and the LUT 165 that were inferred based upon the attribute associated with port 130 of the DRM 105 can be mapped onto the PLD 300. The dotted line representing the route between the inferred flip flop 160 represents routing that will, or can, change from implementation of one function to another within the dynamically reconfigurable region 305. The solid line between the inferred LUT 165 and the static logic 145 indicates a route that is static and that will remain in place for all implementations of functions in reconfigurable region 305.

It should be appreciated that in some cases, for example, where the flip flop 160 is coincident with user logic within the dynamically reconfigurable region 305, the inferred flip flop 160 can be removed. In the case of a black-box implementation, since no function logic is specified within the DRM, logic can be inferred from the attribute(s) associated with each respective pin of the DRM. The optimizations can be applied once the function logic for one or more functions of the DRM is eventually specified.

In implementing the logical netlist, the circuit designer can create timing and/or placement constraints which can control the implementation of the inferred logic and user logic, whether within the DRM or external to the DRM. The circuit design can be implemented according to any user-specified design constraints.

Figure 4:
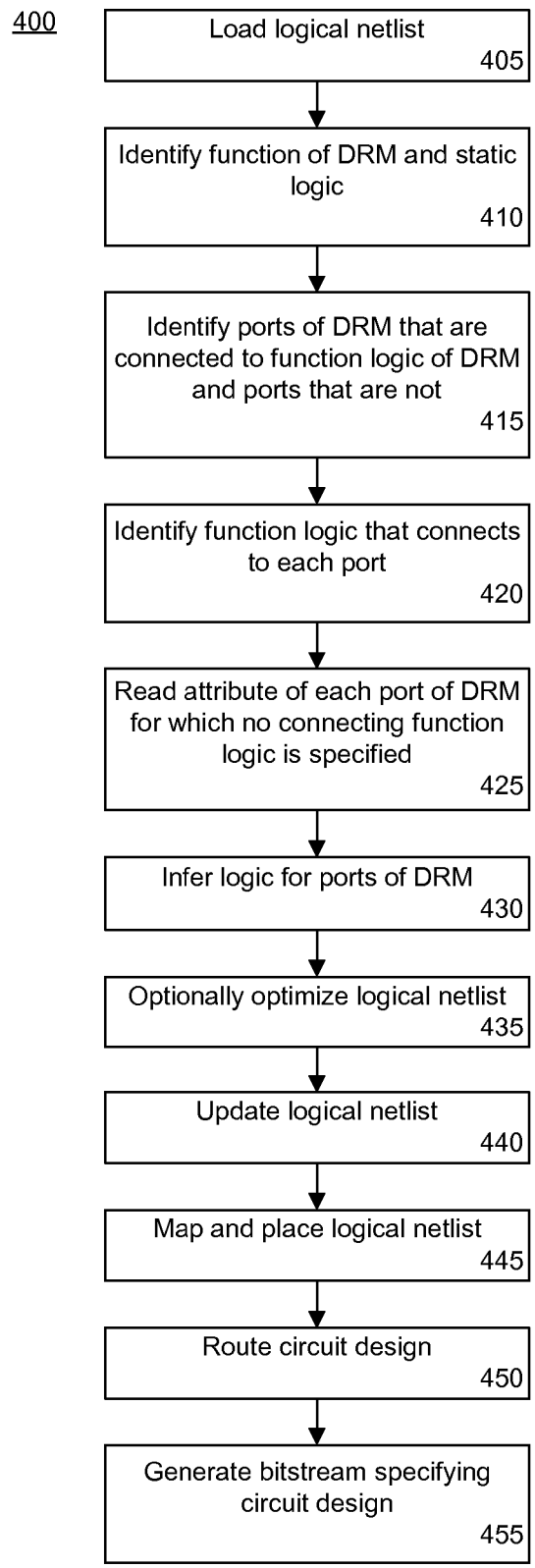
FIG. 4 is a flow chart illustrating a method of creating an interface for a dynamically reconfigurable module (DRM) in accordance with another embodiment of the present invention.

FIG. 4 is a flow chart illustrating a method 400 of creating an interface to a DRM in accordance with another embodiment of the present invention. The method 400 illustrates an example of an in-context flow, where logic for at least one function is specified for at least one pin of the DRM, as discussed herein. The method 400 illustrates the implementation of a first function, or circuit, of the DRM.

The method 400 can begin in step 405 where a logical netlist can be loaded into a software-based design tool such as an HLMS. In step 410, the design tool can identify a function to be implemented within a DRM as well as static logic of the logical netlist. In this example, the DRM can connect with static logic. The logical netlist can specify two or more different functions of the DRM to be selectively implemented within a dynamically reconfigurable region of the PLD.

As noted, though method 400 is described in the context of a DRM connecting to user static logic, it should be appreciated that the DRM can connect with one or more DRMs as well as static logic. Accordingly, the embodiments disclosed herein are not intended to be limited to the case of a DRM connecting only to static logic.

In step 415, the HLMS can identify which ports of the DRM are connected to function logic for the first function of the DRM and which are not. In step 420, for those ports that are connected to function logic, the HLMS can identify the function logic for each such port. In step 425, for those ports that are not connected to function logic, an attribute can be read that is associated with each such port that indicates either synchronous or asynchronous for the associated port.

In step 430, logic can be inferred for the first function of the DRM. The inferred logic can be determined on a port by port basis. For those ports that are connected to function logic within the DRM, a LUT can be inferred for each port. For those ports of the DRM that are not connected to function logic for the first function, the inferred logic can be determined according to the attribute associated with each respective port. It should be appreciated that one or more ports of the current function of the DRM can be asynchronous and that one or more ports can be synchronous. Moreover, a given port can be synchronous for one function and asynchronous in a different, or subsequent, function.

In step 435, the logical netlist optionally can be optimized as described herein. For example, user logic can be used to replace inferred logic, inferred logic can be removed from the circuit design, etc. In step 440, the logical netlist can be updated or modified to specify the inferred logic as well as any optimizations that may have been applied. The updated logical netlist can be stored, output, or otherwise made available for further processing.

In step 445, the logical netlist is mapped and placed with respect to a given target device. It should be appreciated that one or more optimizations also can be applied to the inferred logic subsequent to mapping, i.e., identifying and removing non-essential circuit elements and/or replacing inferred circuit elements with elements of function logic. In one embodiment, static logic is mapped first, followed by the function of the DRM. In another embodiment, the static logic and the DRM are mapped concurrently.

In step 450, the circuit design, e.g., the current function of the DRM and the static logic, are routed. In one embodiment, an optimization can be optionally applied during the routing phase. For example, in some cases, despite not being removed from the logical netlist, inferred logic may not be necessary. Accordingly, the router can route around the inferred logic, which will be included in the circuit design and eventually instantiated on the PLD for the given function. The inferred logic is effectively bypassed by the router. In step 455, a bitstream specifying the circuit design can be generated that, when loaded into a PLD, instantiates the circuit design (specified by the processed logical netlist described herein).

Figure 5:
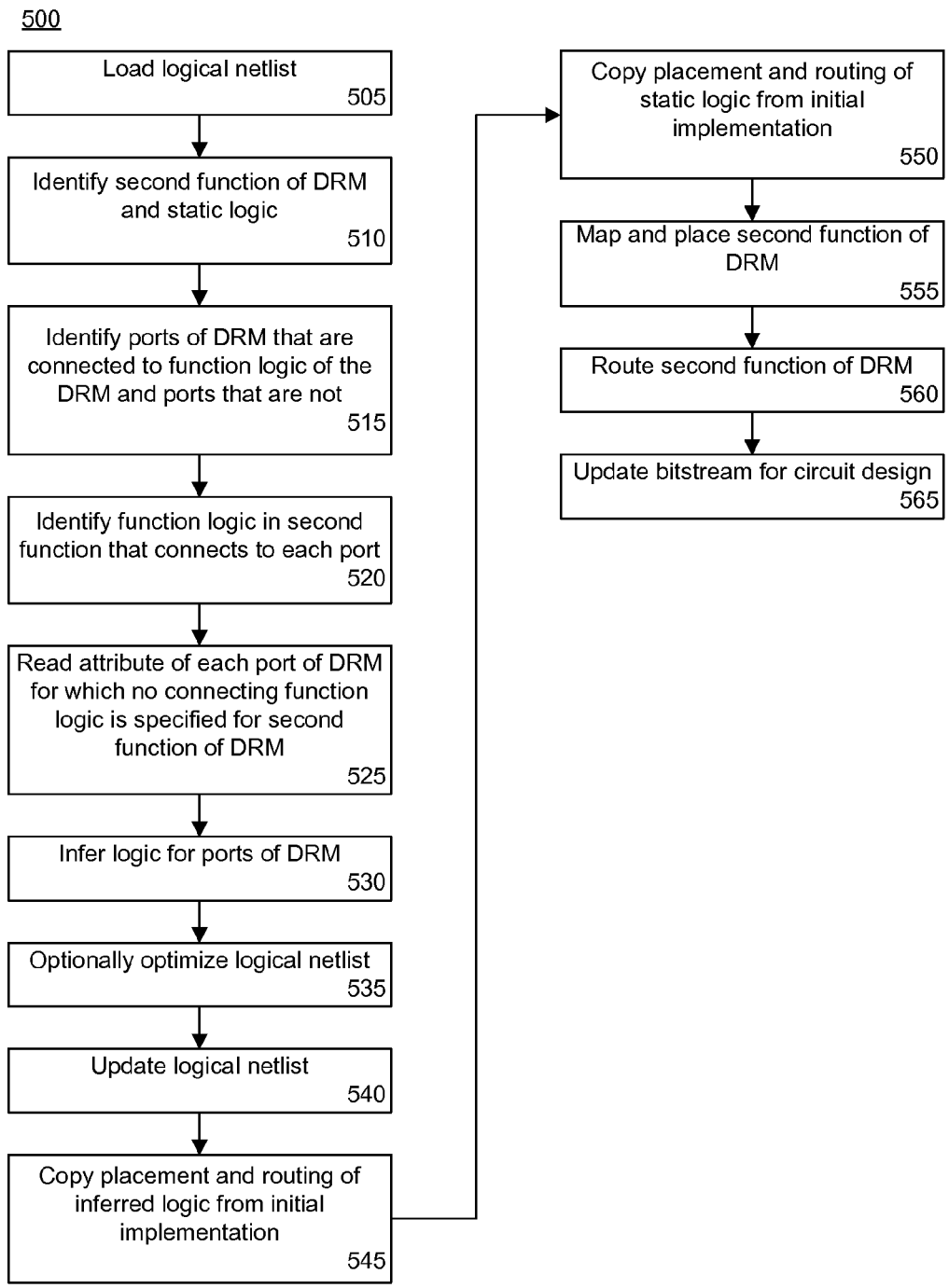
FIG. 5 is a flow chart illustrating a method of creating an interface for a DRM in accordance with another embodiment of the present invention.

FIG. 5 is a flow chart illustrating a method 500 of creating an interface to a DRM in accordance with another embodiment of the present invention. The method 500 illustrates the implementation of a subsequent, e.g., second, function of the DRM. In step 505, the logical netlist is loaded into the HLMS. In step 510, the design tool identifies a second function of the DRM and further identifies static logic of the logical netlist.

In step 515, the HLMS identifies which ports of the DRM are connected to function logic within the second function of the DRM and those that are not. In step 520, for those ports that are connected to function logic for the second function of the DRM, the HLMS identifies the function logic connected to each such port. In step 525, for those ports that are not connected to function logic for the second function of the DRM, an attribute is read that is associated with the port that indicates either synchronous or asynchronous.

In step 530, logic can be inferred for the second function of the DRM. For those ports that are connected to function logic within the DRM, a LUT is inferred for each such port. For those ports of the DRM that are not connected to function logic, the inferred logic is determined according to the attribute associated with each respective port, i.e., the default value.

In step 535, the logical netlist can optionally be optimized as described herein. In step 540, an updated logical netlist can be generated. The updated logical netlist can be stored, output, or otherwise made available for further processing. In step 545, the placement and routing of the inferred logic, as determined in FIG. 4 for the first function of the DRM can be copied. In step 550, the placement and routing of the static logic determined in FIG. 4 can be copied.

In step 555, the second version of the DRM can be mapped and placed with respect to the target device. The second version of the DRM can be routed in step 560. As noted, various optimizations can be applied at various points during processing and/or synthesis of the logical netlist. In step 565, the bitstream for the circuit design can be updated to reflect the determined circuit configurations for the second function of the DRM.

Figure 6:
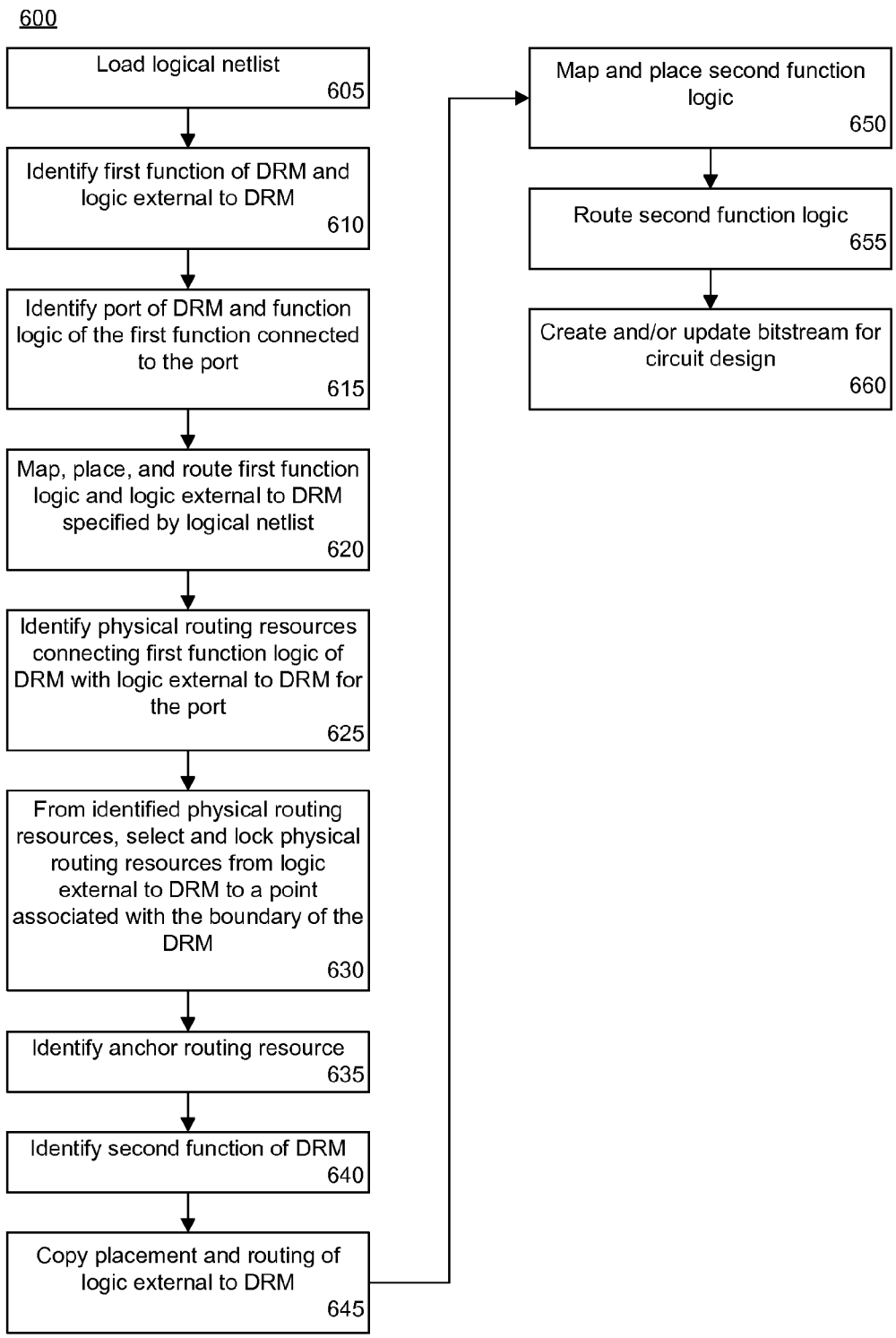
FIG. 6 is a flow chart illustrating a method of creating an interface to a DRM in accordance with yet another embodiment of the present invention.

FIG. 6 is a flow chart illustrating a method 600 of creating an interface to a DRM in accordance with yet another embodiment of the present invention. Method 600 illustrates an embodiment in which no logic is inferred. Rather, a physical routing resource of the target PLD that meets or spans the boundary of the DRM to logic external to the DRM is identified. This routing resource is used as an anchor or target to which internal logic of the DRM is to be routed for further functions implemented within the DRM. For ease of illustration, the method 600 will be described with respect to one port. It should be appreciated, however, that the embodiments described herein can be applied to one or more or each port of the DRM.

The method 600 begins in step 605 where a logical netlist is loaded into a software-based design tool such as an HLMS. In step 610, the design tool identifies a first function to be implemented within a DRM as well as logic of the logical netlist that is external to the DRM. In step 615, the HLMS identifies a port of the DRM and the function logic of the first function of the DRM (first function logic) connected to that port.

In step 620, the first function logic and the logic external to the DRM, as specified by the logical netlist, can be implemented. More particularly, the first function logic of the DRM and logic external to the DRM can be mapped, placed, and routed. In step 625, the physical routing resources, e.g., wires, that connect the first function logic with the logic external to the DRM are identified for the port. In step 630, from the identified physical routing resources for the port, those routing resources from the logic external to the DRM that lead to a point associated with the boundary of the DRM are selected and locked. In one embodiment, the point is located on the boundary of the DRM such that the routing resources include a particular physical routing resource that ends on the boundary of the DRM. In another embodiment, the location is located within the DRM such that the particular routing resource that ends at the location crosses, or spans, the boundary of the DRM. In step 635, the particular physical routing resource that connects to the location, whether on the boundary or within the DRM, is identified as the anchor routing resource.

In step 640, a second function of the DRM can be identified. In step 645, the placement and routing of the logic external to the DRM can be copied, including the routing resource that connects to the location, e.g., the anchor routing resource for the port. In step 650, the second function of the DRM, specifying second function logic, is mapped and placed with respect to the target device.

In step 655, the second function logic is routed. The second function logic can be routed such that the second function logic, for the port, connects to the anchor routing resource. In step 660, the bitstream for the circuit design is generated and/or updated to reflect the determined circuit configurations for the first and second functions of the DRM as well as those portions of the circuit design that are external to the DRM.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. For example, logic can be inferred for a port directly after analyzing that port rather than after analysis of all ports. In another example, one or more of the optimizations noted herein is performed at any of a variety of points within the methods described with reference to FIGS. 4 and/or 5. It also should be noted that each block of the flowchart illustrations, and combinations of blocks in the flowchart illustrations, are implemented by special purpose hardware-based systems that perform the specified functions or acts, or combinations of special purpose hardware and computer instructions.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein.

The present invention also can be embedded in a computer program product, which comprises all the features enabling the implementation of the methods described herein. The computer program product includes a computer-usable or computer-readable medium having computer-usable program code which, when loaded in a computer system, causes the computer system to perform the functions described herein. Examples of computer-usable or computer-readable media include, but are not limited to, optical media, magnetic media, computer memory, one or more portions of a wired or wireless network through which computer-usable program code can be propagated, or the like.

The terms "computer program", "software", "application", "computer-usable program code", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program includes, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising, i.e., open language. The term "coupled", as used herein, is defined as connected, although not necessarily directly, and not necessarily mechanically, e.g., communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. A method of processing a logical netlist for implementing a circuit design within a programmable integrated circuit, the method comprising:
    within the logical netlist, identifying a dynamically reconfigurable module (DRM) comprising a port, wherein the DRM defines a dynamically reconfigurable region of the programmable integrated circuit that communicates with a module of the logical netlist that is not dynamically reconfigurable via the port;
    implementing, by a computer system and within the logical netlist, first circuitry for implementation within the DRM and circuitry external to the DRM, wherein the first circuitry connects to the circuitry external to the DRM via the port, and wherein the circuitry external to the DRM is within the module that is not dynamically reconfigurable;
    locking, by the computer system, routing resources connecting the circuitry external to the DRM to a location associated with a boundary of the DRM for the port; and
    implementing, by the computer system and within the logical netlist, second circuitry, different from the first circuitry, for implementation within the DRM in place of the first circuitry, wherein the second circuitry couples to the external circuitry through the locked routing resources, and wherein the second circuitry is routed within the DRM to connect to the location associated with the boundary of the DRM for the port.

2. The method of claim 1, wherein locking comprises determining a physical routing resource of the programmable integrated circuit at the location associated with the boundary that is used to connect the first circuitry with the circuitry external to the DRM.

3. The method of claim 2, further comprising routing the second circuitry within the DRM to couple to the physical routing resource.

4. The method of claim 1, further comprising outputting a bitstream for the circuit design within the programmable integrated circuit, the bitstream including at least one of the implemented first circuitry of the DRM, the implemented second circuitry of the DRM, or the implemented circuitry external to the DRM.

5. The method of claim 1, wherein:
    locking the routing resources comprises identifying a particular routing resource on the physical programmable integrated circuit that connects the circuitry external to the DRM to the location and the location is on the boundary of the DRM; and
    the particular routing resource is also used to couple the second circuitry within the DRM with the circuitry external to the DRM.

6. The method of claim 1, wherein:
    locking the routing resources comprises identifying a particular routing resource on the physical programmable integrated circuit that connects the circuitry external to the DRM to the location and the location is within the DRM;
    the identified routing resource crosses the boundary of the DRM; and
    the particular routing resource is also used to couple the second circuitry within the DRM with the circuitry external to the DRM.

7. A computer program product, comprising:
    a non-transitory computer-usable medium having computer-usable program code that, when executed by a computer system, causes the computer system to perform a method of processing a logical netlist for implementing a circuit design within a programmable integrated circuit, the method comprising:
    within the logical netlist, identifying a dynamically reconfigurable module (DRM) comprising a port, wherein the DRM defines a dynamically reconfigurable region of the programmable integrated circuit that communicates with a module that is not dynamically reconfigurable via the port;
    implementing first circuitry of the DRM and circuitry external to the DRM within the logical netlist, wherein the first circuitry connects to the circuitry external to the DRM via the port, and wherein the circuitry external to the DRM is within the module that is not dynamically reconfigurable;

locking routing resources connecting the circuitry external to the DRM to a location associated with a boundary of the DRM for the port; and implementing, within the logical netlist, second circuitry different from the first circuitry for implementation within the DRM in place of the first circuitry, wherein the second circuitry couples to the external circuitry through the locked routing resources, and wherein the second circuitry is routed to connect to the location associated with the boundary of the DRM for the port.

8. The computer program product of claim 7, wherein locking comprises determining a physical routing resource of the programmable integrated circuit at the location associated with the boundary that is used to connect the first circuitry with the circuitry external to the DRM.

9. The computer program product of claim 8, the method further comprising routing the second circuitry within the DRM to couple to the physical routing resource.

10. The computer program product of claim 7, the method further comprising outputting a bitstream for the circuit design within the programmable integrated circuit, the bitstream including at least one of the implemented first circuitry of the DRM, the implemented second circuitry of the DRM, or the implemented circuitry external to the DRM.

11. The computer program product of claim 7, wherein:
locking the routing resources comprises identifying a particular routing resource on the physical programmable integrated circuit that connects the circuitry external to the DRM to the location and the location is on the boundary of the DRM;
the identified routing resource crosses the boundary of the DRM; and
the particular routing resource is also used to couple the second circuitry within the DRM with the circuitry external to the DRM.

12. The computer program product of claim 7, wherein:
locking the routing resources comprises identifying a particular routing resource on the physical programmable integrated circuit that connects the circuitry external to the DRM to the location and the location is within the DRM;
the identified routing resource crosses the boundary of the DRM; and
the particular routing resource is also used to couple the second circuitry within the DRM with the circuitry external to the DRM.

13. A system for processing a logical netlist for implementing a circuit design within a programmable integrated circuit, the system comprising:
a computer, wherein the computer is configured to perform executable operations comprising:
within the logical netlist, identifying a dynamically reconfigurable module (DRM) comprising a port, wherein the DRM defines a dynamically reconfigurable region of the programmable integrated circuit that communicates with a module that is not dynamically reconfigurable via the port;

implementing first circuitry of the DRM and circuitry external to the DRM within the logical netlist, wherein the first circuitry connects to the circuitry external to the DRM via the port, and wherein the circuitry external to the DRM is within the module that is not dynamically reconfigurable;

locking routing resources connecting the circuitry external to the DRM to a location associated with a boundary of the DRM for the port; and implementing, within the logical netlist, second circuitry different from the first circuitry for implementation within the DRM in place of the first circuitry, wherein the second circuitry couples to the external circuitry through the locked routing resources, and wherein the second circuitry is routed to connect to the location associated with the boundary of the DRM for the port.

14. The system of claim 13, wherein locking comprises determining a physical routing resource of the programmable integrated circuit at the location associated with the boundary that is used to connect the first circuitry with the circuitry external to the DRM.

15. The system of claim 13, wherein the computer is further configured to implement an executable operation comprising:
routing the second circuitry within the DRM to couple to the physical routing resource.

16. The system of claim 13, wherein the computer is further configured to implement an executable operation comprising:
outputting a bitstream for the circuit design within the programmable integrated circuit, the bitstream including at least one of the implemented first circuitry of the DRM, the implemented second circuitry of the DRM, or the implemented circuitry external to the DRM.

17. The system of claim 13, wherein:
locking the routing resources comprises identifying a particular routing resource on the physical programmable integrated circuit that connects the circuitry external to the DRM to the location and the location is on the boundary of the DRM; and
the particular routing resource is also used to couple the second circuitry within the DRM with the circuitry external to the DRM.

18. The system of claim 13, wherein:
locking the routing resources comprises identifying a particular routing resource on the physical programmable integrated circuit that connects the circuitry external to the DRM to the location and the location is within the DRM;
the identified routing resource crosses the boundary of the DRM; and
the particular routing resource is also used to couple the second circuitry within the DRM with the circuitry external to the DRM.

* * * * *